(12) United States Patent
Komatsu et al.

(10) Patent No.: US 10,403,340 B2
(45) Date of Patent: Sep. 3, 2019

(54) TECHNIQUES FOR COMMAND SYNCHRONIZATION IN A MEMORY DEVICE

(71) Applicant: Micron Technology, Inc., Boise, ID (US)

(72) Inventors: Yoshiya Komatsu, Sagamihara (JP); Kazutaka Miyano, Sagamihara (JP); Atsuko Momma, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 15/890,943

(22) Filed: Feb. 7, 2018

(65) Prior Publication Data

US 2019/0244644 A1 Aug. 8, 2019

(51) Int. Cl.
*G11C 7/22* (2006.01)
*G11C 8/10* (2006.01)
*H03L 7/08* (2006.01)

(52) U.S. Cl.
CPC .............. *G11C 7/222* (2013.01); *G11C 8/10* (2013.01); *G11C 7/225* (2013.01); *H03L 7/08* (2013.01)

(58) Field of Classification Search
CPC ........... G11C 7/222; G11C 8/10; G11C 7/225; H03L 7/08
USPC ....................................................... 375/372
See application file for complete search history.

(56) References Cited

U.S. PATENT DOCUMENTS

| 8,269,535 B1* | 9/2012 | Chou | H03L 7/0816 327/149 |
| 9,135,979 B2* | 9/2015 | Nakamura | G11C 7/1066 |
| 9,601,170 B1 | 3/2017 | Mazumder | |
| 2010/0277992 A1* | 11/2010 | Noh | G11C 7/1051 365/189.14 |
| 2010/0302893 A1 | 12/2010 | Sato et al. | |
| 2011/0175654 A1* | 7/2011 | Lee | G11C 7/1051 327/158 |
| 2011/0187427 A1* | 8/2011 | Kim | H03L 7/06 327/158 |
| 2012/0051161 A1* | 3/2012 | Grunzke | G11C 7/222 365/194 |
| 2013/0121094 A1* | 5/2013 | Zerbe | H03L 7/091 365/194 |
| 2013/0329507 A1* | 12/2013 | Choi | G11C 7/222 365/194 |
| 2014/0286111 A1 | 9/2014 | Jung | |
| 2014/0340969 A1* | 11/2014 | Jung | G11C 7/222 365/189.05 |

(Continued)

OTHER PUBLICATIONS

U.S. Appl. No. 15/243,651, filed Aug. 22, 2016, Kazutaka Miyano.
PCT International Search Report & Written Opinion for PCT Application No. PCT/ US2018/051508 dated Jan. 9, 2019; 15 Pages.

Primary Examiner — Hirdepal Singh
(74) Attorney, Agent, or Firm — Fletcher Yoder, P.C.

(57) ABSTRACT

An apparatus, such as a memory device, that includes circuits and techniques to synchronize various internal signals with an internal clock signal to ensure proper functionality of the memory device through various modes of operation. A clock enable control circuit is provided to control the input of a delay locked loop circuit to provide a locked condition based on a particular type of command input and the state of various control signals to allow for multiple locking conditions and adjustments based on a length of a clock cycle of the internal clock signal.

21 Claims, 14 Drawing Sheets

(56) References Cited

U.S. PATENT DOCUMENTS

2015/0372683 A1* 12/2015 Takahashi ............ G11C 11/4076
                                                    365/233.1
2016/0351245 A1* 12/2016 Kano ................... G11C 11/4076
2017/0052584 A1*  2/2017 Patil ...................... G11C 7/1057
2017/0140808 A1   5/2017 Jung et al.

* cited by examiner

| MODE | DLLCKCTEN | WBTSEL<1:0> | | T3/T2EN | T1EN |
|------|-----------|------|------|---------|------|
| | | LSB | MSB | | |
| 3T-S | L | H | H | H | L |
| 3T-N | H | H | H | H | L |
| 2T-S | L | L | L | L | L |
| 2T-N | H | L | L | L | L |
| 1T-S | L | L (H) | H (L) | V | H |
| 1T-N | H | L (H) | H (L) | V | H |

FIG. 5

TECHNIQUES FOR COMMAND SYNCHRONIZATION IN A MEMORY DEVICE

BACKGROUND

Embodiments described herein relate generally to the field of memory devices. More specifically, the current embodiments include one or more systems, devices, and methods for command synchronization in memory devices.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In semiconductor memory, proper operation of the memory device is based on the correct timing of various internal command and clock signals. For example, in reading data from the memory device, internal clock signals that clock data path circuitry to provide (e.g. output) the read data should be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to the memory device, internal clock signals that clock data path circuitry to latch write data should be provided with specific timing relationships with internal write command signals to properly enable the data path circuitry to provide the latched write data for writing to the memory device. Inaccurate timing of the internal command and clock signals could result in the write command being inadvertently ignored or incorrect write data being provided to the memory device (e.g., the write data is associated with another write command).

Moreover, as known, a "latency" may be selected (e.g., programmed, desired, used, given, etc.) to set a time, typically in numbers of clock periods T, between receipt of a read command by the memory device and when the data is output by the memory device. A "write latency" may also be selected to set a time, also typically in numbers of T, between receipt of a write command by the memory device and when the write data is provided to the memory device. The latencies may be selected, for example, to accommodate clock signals of different frequencies (i.e., different clock periods).

As appreciated, the higher the frequency of the clock signals in memory devices, the more challenging it may be to generate correctly timed internal clock and command signals. For example, the frequency of memory clock signals can be 1 GHz or higher. Further complicating the matter is that multi-data rate memories may provide and receive data at a rate higher than the memory clock signal, which may represent the rate at which commands may be executed. As a result, command signals and an internal clock signal may need to be synchronized in order to maintain proper timing. An example of a multi-data rate memory is one that outputs read data at a rate twice that of the clock frequency, such as outputting data synchronized with rising and falling clock edges of the memory clock signal.

Thus, to ensure command synchronization in synchronous memory devices, certain circuits may be provided at inputs of the memory device, outputs of the memory device and internal to the memory device. As appreciated, additional circuitry may utilize additional power. In designing components of memory devices to aid in command and clock synchronization, power consumption provides an additional factor that may be considered and reduced whenever possible, without reducing the efficacy of the memory device and synchronization of command signals in the memory device.

BRIEF DESCRIPTION OF DRAWINGS

FIG. 5 illustrates various signal states of the operational modes possible using the control block of FIG. 2, in accordance with an embodiment of the present disclosure;

DETAILED DESCRIPTION

Figure 1:
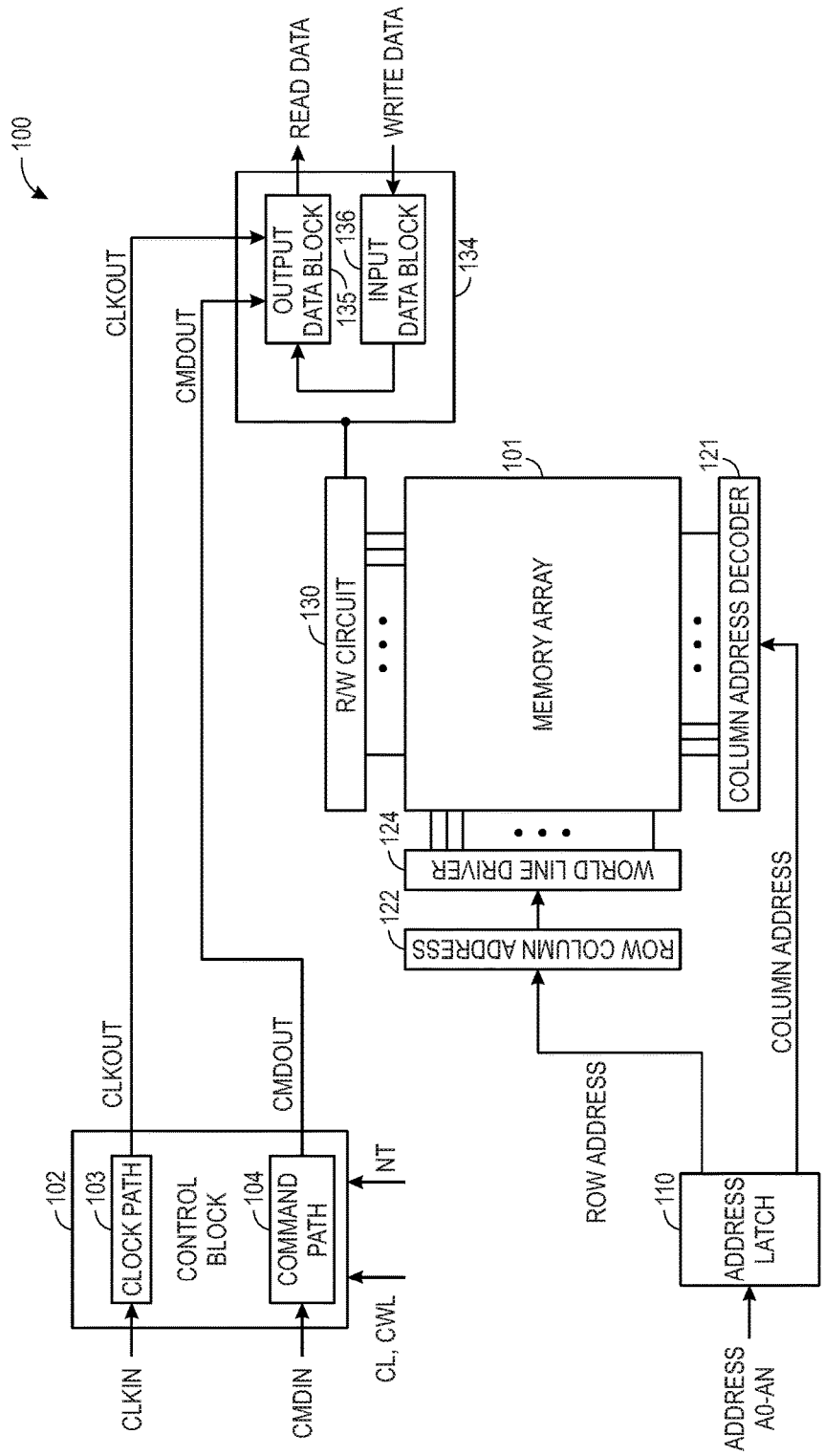
FIG. 1 is a block diagram of an apparatus including a control circuit, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, memory devices may employ circuits and techniques to synchronize various internal signals with an internal clock signal to ensure proper functionality of the memory device through various modes of operation. For instance, in synchronous dynamic random access memory (SDRAM), such as double data rate type four SDRAM (DDR4 SDRAM) or double data rate type five SDRAM (DDR5 SDRAM), the synchronization of command signals, such as read and write command signals, with an internal clock signal is desirable to ensure proper operation of the memory device. More specifically, and as described in detail below, delayed command read (DCMDR) signals or delayed command write (DCMDW) signals, may be generated internally to the memory device responsive to receipt of the read command or the write command. To ensure proper timing, the DCMDR and DCMDW signals are synchronized with an internal clock signal, such as a delay locked loop clock signal (DLLCLK), that provides an adjustable delay based on a system clock signal (SCLK).

As further described below, in order to synchronize the DCMDR and DCMDW signals with the DLLCLK, it may be necessary to control the timing at which an internal command signal (ICMD) is latched by (or synchronized with) the SCLK at an internal timing circuit to provide a latched command signal (LCMD). The synchronization of the DCMDR and DCMDW signals with the DLLCLK may be performed by a read/write dQ-Enable-Delay (R/W QED) circuit based on a number of signals, such as a CAS latency signal (CL) and/or a CAS write latency signal (CWL), as well as a value or delay indication signal (NT) that indicates a number of clock cycles equivalent to a delay between receipt of the SCLK signal and the DLLCLK signal. As will be appreciated, the delay locked loop (DLL) that provides the internal DLLCLK may require certain set-up time from the initiation of operation to the locked condition. The values of the NT/CL/CWL signals are determined by the number of clock cycles of the external clock (CK) and thus, SCLK, and are dependent on the clock cycle (tCK) of the CK signal. For this reason, higher frequency (or lower tCK) of the CK may cause the read or write data (DQ) not to be synchronized with the DLLCLK within the time corresponding to the values of the NT/CL/CWL.

In accordance with embodiments described herein, based on the values of the NT/CL/CWL signals, the start timings of providing the SCLK to the DLL are controllable between making the start timing in response to R/W commands and making the start timing earlier than R/W commands (such as making the start timing in response to active (ACT) commands). In accordance with further embodiments, multiple modes of operation for the synchronization of the ICMD with the SCLK at the timing circuit (i.e., providing timings of LCMD), are provided. For instance, modes of operation having three different types/cycles (3T, 2T and 1T, where T is a clock period and 3T, 2T and 1T indicate different numbers of clock periods), or three different lengths of the tCK of the CK(SCLK), are provided. That is, a first type (3T) indicates that ICMD is synchronized with the SCLK to provide the LCMD in case of the tCK of the CK (SCLK) being relatively short. A second type (2T) indicates that ICMD is synchronized with the SCLK to provide the LCMD in case of the tCK of the CK (SCLK) being of moderate length. A third type (1T) indicates that ICMD is synchronized with the SCLK to provide the LCMD in case of the tCK of the CK (SCLK) being relatively long. In addition, circuitry, such as a DLL clock enable control circuit (DLL-CKENCNT), may be provided at the input stage of the DLL to start providing the SCLK to the DLL to trigger the R/W commands to reduce power consumption, in accordance with embodiments described herein.

Referring now to FIG. 1, a block diagram of a portion of an apparatus 100 including a control circuit in accordance with an embodiment of the present disclosure is illustrated. As used herein, an "apparatus" can refer to, for example, circuitry, a semiconductor die, a device, or a system. The apparatus 100 includes a memory array 101 of memory cells, which may be, for example, dynamic random access memory (DRAM) memory cells, static random access memory (SRAM) memory cells, flash memory cells, or some other types of memory cells. The apparatus 100 includes a control block 102 that receives memory commands and provides (e.g., generates) corresponding control signals within the apparatus 100 to execute various memory operations.

Row and column address signals are provided (e.g., applied) to the apparatus 100 via an address latch 110. The address latch 110 captures the received address signals, and then provides a column address and a row address to a column address decoder 121 and a row address decoder 122, respectively. The column address decoder 121 selects bit lines extending through the memory array 101 corresponding to respective column addresses. The row address decoder 122 is coupled to a word line driver 124 that activates respective rows of memory cells in the memory array 101 corresponding to received row addresses. The selected data line (e.g., a bit line or bit lines) corresponding to a received column address is coupled to a read/write circuit 130 to provide read data to an input/output (I/O) data block 134. Write data is provided to the memory array 101 through the I/O data block 134 and the read/write circuit 130. The I/O data block 134 may include an output data block 135 and an input data block 136 that operate responsive to an internal clock signal CLKOUT and an internal command signal CMDOUT, for example. The output data block 135 may provide read data from the memory array 101, responsive to a command for read operations. In some embodiments, the output data block 135 may provide the read data responsive to the internal command signal CMDOUT. The input data block 136 may receive write data responsive to a command for write operations.

The control block 102 includes a clock path 103. The clock path 103 receives an external clock signal CLKIN and propagates an internal clock signal CLKOUT which is based at least in part on the external clock signal CLKIN to the I/O data block 134.

The control block 102 also includes a command path 104. The command path 104, which is shown in FIG. 1 as being included in the control block 102, but is not limited to such a configuration, provides the internal command signal CMDOUT to the I/O data block 134. The control block 102 responds to memory commands CMDIN to perform various operations on the memory array 101. In particular, the control block 102 is used to provide internal control signals to read data from and write data to the memory array 101. The command path 104 receives latency signals such as a CAS latency signal CL and a CAS write latency signal CWL. The command path 104 further receives a delay indication signal (NT). The command path 104 also receives internal clock signals from the clock path 103.

Figure 2:
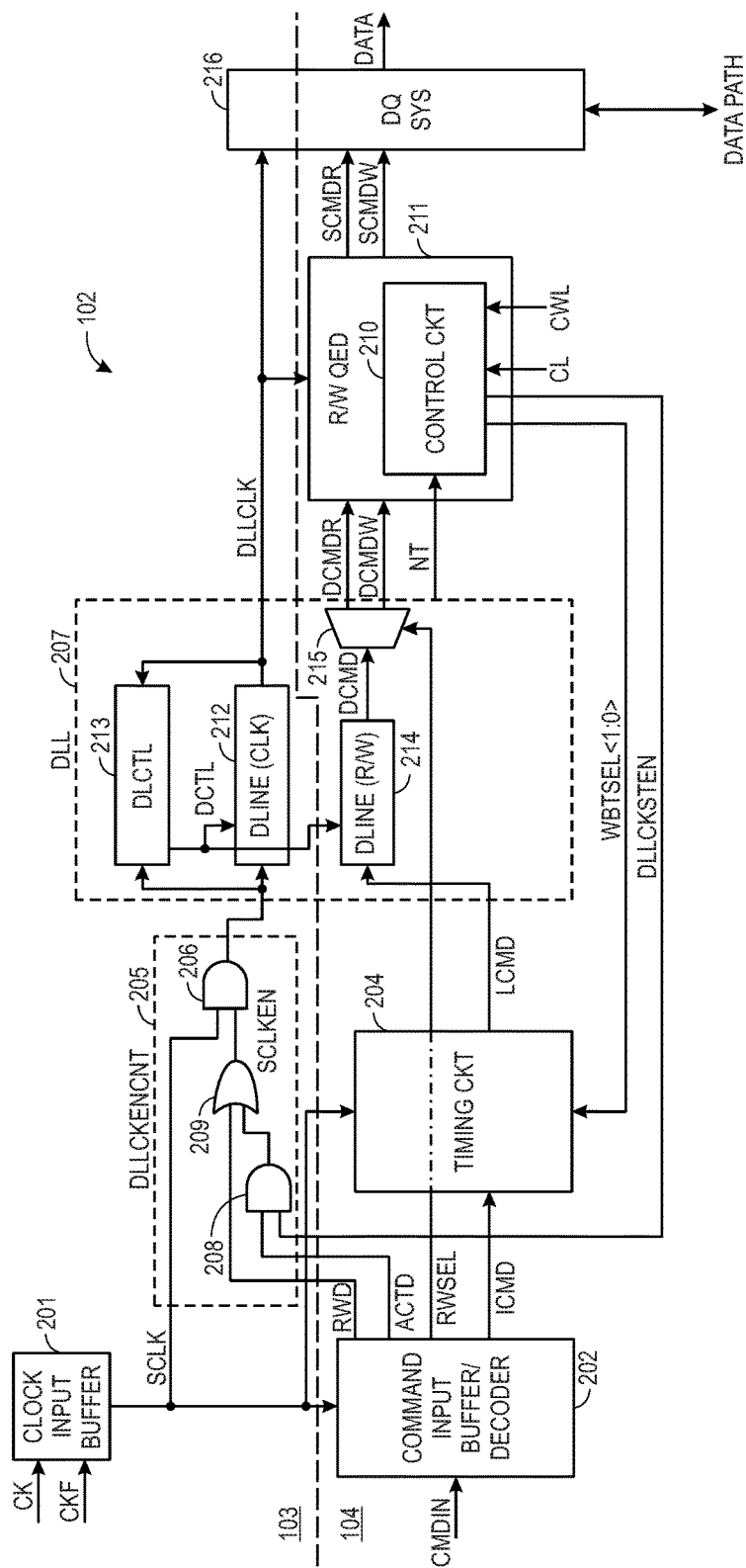
FIG. 2 is a block diagram of a control block of FIG. 1, in accordance with an embodiment of the present disclosure.

FIG. 2 is a more detailed view of the control block 102 of FIG. 1, in accordance with an embodiment of the present disclosure. As previously described, the control block 102 may include the clock path 103 and the command path 104. The control block 102 may include a timing circuit 204 in the command path and a delay (DLL) circuit 207 among the clock path 103 and the command path 104. The clock path 103 includes a clock input buffer 201. The clock input buffer 201 may receive a pair of complementary clock signals CK and CKF based on a clock signal CLKIN (FIG. 1), for example, and provides a system clock signal SCLK. The SCLK signal may be provided to a command input buffer/decoder circuit 202 and the timing circuit 204 on the command path 104 and a DLL clock enable control circuit (DLLCKENCNT) 205 on the clock path 103.

In the illustrated embodiment, the DLLCKENCNT 205 includes a first AND gate 206, a second AND gate 208 and an OR gate 209. The AND gate 206 provides the SCLK signal to the DLL 207, responsive to a system clock enable signal SCLKEN that is responsive to the CMDIN signal indicative of the read command or the write command (RWD). The AND gate 208 is supplied with an ACTD signal from the command input buffer/decoder circuit 202 and a DLLCKSTEN signal from control circuitry (CKT) 210 in the read/write dQ-Enable-Delay (R/W QED) circuit 211. The ACTD signal is set to the high level when the CMDIN signal indicative of an active (ACT) command is decoded. The DLLCKSTEN signal and the control circuitry 210 in the R/W QED 211 will be discussed in further detail below. The OR gate 209 is supplied with a RWD signal from the command input buffer/decoder circuit 202 and the output of the AND gate 208, and the output of the OR gate 209 is provided as the SCLKEN signal. The RWD signal is set to the high level when any of the Read commands and Write commands are decoded. Accordingly, when the DLLCKSTEN signal is at the low level, the SLCK starts to be transferred to the DLL 207 in response to the receipt of the R/W command (any of the Read and Write commands) that is issued after the issue of the ACT command. On the other hand, when the DLLCKSTEN signal is at the low level, the SLCK starts to be transferred to the DLL in response to the receipt of the ACT command that is issued before the issue of the R/W command.

The DLL circuit 207 may include a delay line (DLINE CLK) 212 and a delay control (DLCTL) circuit 213 on the clock path 103. The SCLK signal may be provided to the DLINE CLK 212 on the clock path 103 via the AND circuit 206 that may provide the SCLK signal responsive to a system clock enable signal SCLKEN that is responsive to the CMDIN signal indicative of a read command or the write command. Thus, the DLL circuit 207 may be active during the read and write operations. The DLL circuit 207 may adjust the delay of the delay lines 212 and 214 by changing a delay control signal DCTL responsive to the SCLK signal and a DLL clock signal when it is activated. On the other hand, the DLL circuit 207 may keep the delay of the delay lines 212 and 214 when it is deactivated. For example, the delay line 212 may be an adjustable delay line including a duty cycle controller (DCC), a coarse delay line and a fine delay line. An adjustable delay of the delay line 212 may adjust based on a delay control signal DCTL provided by the DLCTL circuit 213. The delay line 212 may provide a DLL clock signal DLLCLK having the adjustable delay relative to the SCLK signal on the clock path 103. The DLCTL circuit 213 may provide the DCTL signal to the delay line 212, responsive to the SCLK signal from the AND circuit 206 and the DLLCLK signal. The delay line 212 may further provide the DLLCLK signal to a read/write R/W QED) circuit 211 on the command path 104.

The command path 104 in the control block 102 includes the command input buffer/decoder circuit 202. The command input buffer/decoder circuit 202 may receive command signals CMDIN and the SCLK signal. The CMDIN signals may convey a memory access command, such as a read command, a write command, or an on-die termination (ODT) command indicative of instructing a read operation, a write operation or an on-die termination, respectively. The command input buffer/decoder circuit 202 may decode the CMDIN signals, responsive to the SCLK signal. The command input buffer/decoder circuit 202 may provide an internal command signal ICMD to the timing circuit 204 and may further provide a read/write selection signal RWSEL indicative of a read operation or a write operation responsive to the CMDIN signal indicative of the read command or the write command. The ICMD signal may be a read signal or a write signal. The timing circuit 204 may provide a latched command signal LCMD responsive to the ICMD signal and a walk-back select WBTSEL<1:0> signal that will be described in detail below, where the timing circuit 204 may control a timing of the LCMD signal relative to the ICMD signal such that the LCMD signal is synchronized with the SCLK signal. As will be appreciated, though not illustrated in FIG. 2 for simplicity, the command input buffer/decoder circuit 202 may provide an internal ODT command signal to the timing circuit 204 responsive to the CMDIN signal indicative of an on-die termination command. Those skilled in the art will appreciate the operations associated with ODT commands.

The DLL circuit 207 may further include a delay line (DLINE R/W) 214 coupled to the timing circuit 204 on the command path 104. For example, the delay line 214 may be an adjustable delay line including a DCC, a coarse delay line and a fine delay line. In some embodiments, the delay line 214 may have substantially the same circuit structure as the delay line 212 and may provide substantially the same delay as the delay line 212. An adjustable delay of the delay line 214 may adjust based on the delay control signal DCTL provided by the DLCTL circuit 213. The LCMD signal from the timing circuit 204 is transmitted to the delay line 214. The delay line 214 may provide a delayed command signal DCMD responsive to the LCMD signal and further responsive to the DCTL signal that is based on the SCLK signal and the DLLCLK signal. The DCMD signal may be transmitted to a demultiplexer 215. The demultiplexer 215 may provide either a delayed command read signal DCMDR based on the read command or a delayed command write signal DCMDW based on the write command responsive to the RWSEL signal.

The command path 104 further includes the R/W QED circuit 211. The R/W QED circuit 211 may receive a selected latency (e.g., a CL value and/or a CWL value) and an NT value. The R/W QED circuit 211 may further receive the DLLCLK signal from the delay line 212. The latency may be defined by a number of clock cycles, for example, of the CLK signal. The NT value may be a number of clock cycles equivalent to a delay between receipt of the SCLK signal and the DLLCLK signal. The CL value is column address strobe (CAS) latency that may account for a delay time between when the apparatus receives the read command and when an output buffer in a data queue system (DQ sys) circuit 216 receives read data responsive to the read command based on a clock signal (e.g., the DLLCLK signal) including time for data to be accessed and provided to an output bus (e.g., via a DQ pad in the DQ sys circuit 216). The CWL value is CAS write latency that may account for a delay time between when the apparatus receives the write command and when the input data block 136 in FIG. 1 receives write data responsive to the write command based on DQS signals (not shown) including time for data to be accessed and provided to an input bus (e.g., via a DQ pad before the input data block 136). The CL value and the CWL value may be represented as numbers of clock cycles of the CLK signal. The CL value and the CWL value may be frequency dependent values, for example.

The R/W QED circuit 211 may synchronize the DCMDR signal or the DCMDW signal from the demultiplexer 215 with the DLLCLK signal from the delay line 212, for example, by adjusting a latency (e.g., shifting) of the DCMDR signal or the DCMDW signal using the NT value and the CL value or the CWL value. For example, in some embodiments, the R/W QED circuit 211 may shift the DCMDR signal for the read command responsive to the CL. In some embodiments, the R/W QED circuit 211 may shift the DCMDW signal for the write command responsive to the CWL. An adjustment factor may also be considered. For example, in some embodiments, the NT value may be greater than or equal to nine. For example, in some embodiments, the CL value and the NT value may have to satisfy the condition that a difference between the CL value and the NT value (e.g., CL−NT) is greater or equal to two. In some embodiments, the R/W QED circuit 211 shifts the DCMDR signal by (CL−(NT+2)) clock cycles of the DLLCLK signal for read commands, where two is the adjustment factor. Operation of the R/W QED circuit 211 and the control circuit 210 will be described in greater detail below, with regard to FIGS. 3 and 4.

As previously described and as discussed in further detail below, the control circuit 210 of the R/W QED circuit 211 may provide a DLLCKSTEN signal to the timing circuit 204 responsive to latency information (e.g., based on a calculation of the CL value or the CWL value and the NT value). For, example, as described in greater detail with regard to FIGS. 3 and 4 below, the DLLCKSTEN signal may provide for either a 3-cycle-operation (3T), a 2-cycle-operation (2T) or a 1-cycle-operation, based on calculations by the control circuit 210 using the CL, CWL and NT values that are dependent on tCK of the CK (SCLK) actually applied to the memory device and/or on the performance of the memory device caused by PVT (Process/Voltage/Temperature) variation thereof. In one embodiment, the timing circuit 204 will perform a 3T operation, a 2T operation or a 1T operation, based on the DLLCKSTEN signal, in accordance with FIG. 4, as described in detail below.

In operation, the read command or the write command represented by the CMDIN signal is provided to the command path 104 and propagated through the command input buffer/decoder circuit 202 as the ICMD signal, the timing circuit 204 as the LCMD signal, the delay line 214 as the DCMD signal, the demultiplexer 215 as the DCMDR signal or the DCMDW signal, and the R/W QED circuit 211. The R/W QED circuit 211 adds clock cycles of the DLLCLK signal to the propagating command signal, either the DCMDR signal or the DCMDW signal, to provide a shifted command read signal SCMDR or a shifted command write signal SCMDW resulting in propagation delay for the command path 104 responsive to the selected latency.

The I/O data block 134 in FIG. 1 may include the DQ sys circuit 216 in FIG. 2. The DQ sys circuit 216 may receive the DLLCLK signal, the SCMDR signal and the SCMDW signal. For example, the DQ sys circuit 216 may include a parallel-to-serial converter which converts data of a plurality of bits read in parallel from the memory array 101 in FIG. 1 via the R/W circuit 130 to a set of serial data in an appropriate order based on the timings. The DQ sys circuit 216 may provide the data to a data queue (e.g., DQx) on a data path.

Figure 3:
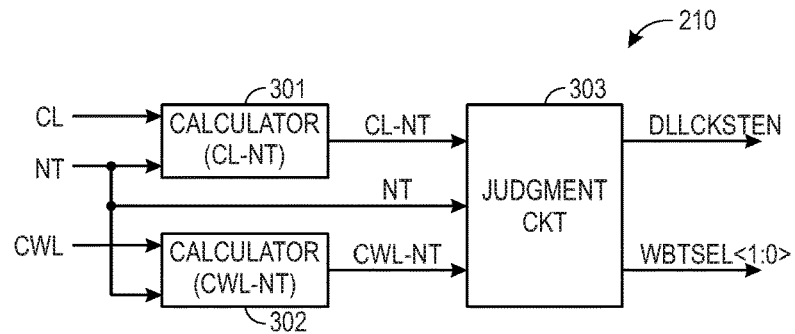
FIG. 3 is a block diagram of a portion a control circuit (CKT) of the control block of FIG. 2, in accordance with an embodiment of the present disclosure.

Turning now to FIG. 3, one embodiment of the control circuit 210 of the R/W QED circuit 211 is illustrated. As previously described, the control circuit 210 generates the DLLCKSTEN signal for the DLLCKENCNT 205 and the WBTSEL<1:0> signal for the timing circuit 204. The DLLCKSTEN signal and the 2-bit WBTSEL<1:0> signal are generated using the CL signal, the CWL signal and NT value, each provided to the control circuit 210, as previously described. In the illustrated embodiment, the control circuit 210 includes a first calculator circuit 301, a second calculator circuit 302 and a judgment circuit 303. As illustrated, the first calculator circuit 301 is configured to calculate the value of CL−NT. The second calculator circuit 302 is configured to calculate the value of CWL−NT. The judgment circuit 303 is configured to receive the outputs from the first calculator circuit 301, the second calculator circuit 302 and the NT value and is configured to provide the DLLCKSTEN signal and the WBTSEL<1:0> signal responsive to the inputs of the judgment circuit 303, according to the operation flow of FIG. 4.

Figure 4:
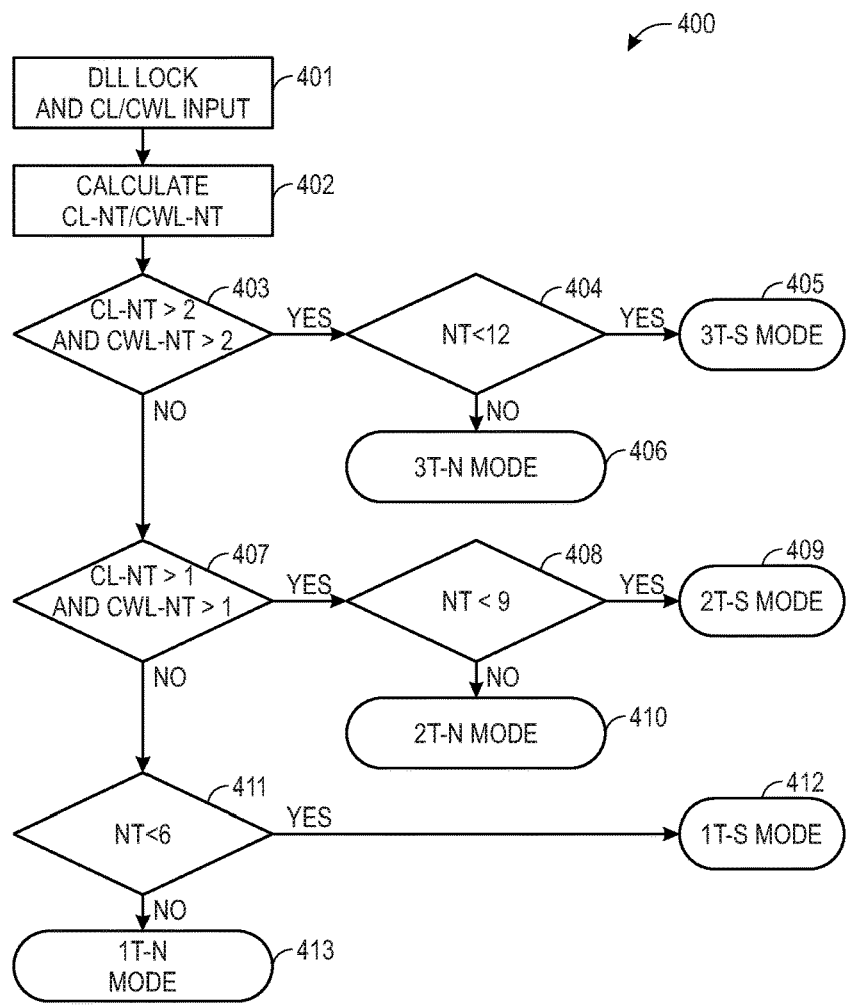
FIG. 4 is a flow chart of the operation of the control CKT of FIG. 3, in accordance with an embodiment of the present disclosure.

FIG. 4 is an operational flow chart of a process 400, indicative of the operations of the control circuit 210 of FIG. 3. As described, in accordance with the process 400, the control circuit 210 will bring the control block 102 of FIG. 2 into one of 6 operational modes: 3T-S mode, 3T-N mode, 2T-S mode, 2T-N mode, 1T-S mode and 1T-N mode, wherein:

"S" in the respective mode indicates that the SCLK has started to transfer to the DLL in response to the receipt of the R/W commands;

"N" in the respective mode indicates that the SCLK has started to transfer to the DLL in response to the receipt of the ACT commands;

3T indicates that ICMD is synchronized with the SCLK to provide the LCMD in case of the tCK of the CK (SCLK) being a relatively short duration;

2T indicates that ICMD is synchronized with the SCLK to provide the LCMD in case of the tCK of the CK (SCLK) being a middle duration; and 1T indicates that ICMD is synchronized with the SCLK to provide the LCMD in case of the tCK of the CK (SCLK) being a relatively long duration.

With reference to FIGS. 3 and 4, the process 400 begins when the DLL 207 achieves a locked condition and the control circuit 210 receives the NT value from the DLL 207 and each of the CL and CWL signals (block 401). Next, the calculator circuit 301 calculates the value of CL−NT and the calculator circuit 302 calculates the value of CWL−NT (block 402). These values, along with the NT value, are then passed to the judgment circuit 303. The judgment circuit 303 uses these values to output the DLLSCKSTEN signal to the DLLCKENCNT 205 and the WBTSEL<1:0> to the timing circuit 204 in order to set the control block 102 into one of the 6 modes of operation described above.

First, the judgment circuit 303 determines whether the values of CL–NT and CWL–NT are each greater than 2 (block 403). If both values are greater than 2, the judgment circuit 303 determines whether the NT value is less than a long number of clock cycles of delay (e.g., 12) (block 404). If the NT value is less than 12, the control block 102 is set to a 3T-S mode of operation (block 405). If the value of NT is greater than 12, the control block 102 is set to a 3T-N mode of operation (block 406).

Returning to block 403, if the judgment circuit 303 determines that both of the values of CL–NT and CWL–NT are not greater than 2, the judgment circuit 303 determines whether both of the values of CL–NT and CWL–NT are greater than 1 (block 407). If both values are greater than 1, the judgment circuit 303 determines whether the NT value is less than a medium number of clock cycles of delay (e.g., 9) (block 408). If the NT value is less than 9, the control block 102 is set to a 2T-S mode of operation (block 409). If the value of NT is greater than 9, the control block 102 is set to a 2T-N mode of operation (block 410).

Returning to block 407, if the judgment circuit 303 determines that both of the values of CL–NT and CWL–NT are not greater than 1 (i.e., equal to zero), the judgment circuit 303 determines whether the NT value is less than a short number of clock cycles of delay (e.g., 6) (block 411). If the NT value is less than 6, the control block 102 is set to a 1T-S mode of operation (block 412). If the value of NT is greater than 6, the control block 102 is set to a 1T-N mode of operation (block 413).

FIG. 5 is a table 500 showing logic level states, high (H) or low (L), of the DLLCKTEN signal and the WBYSEL<1:0> signal in the 6 modes of operation enabled by the control circuit 210 of the R/W QED 211 described with reference to FIGS. 3 and 4. As indicated, the logic levels of the LSB and MSB of the WBYSEL<1:0> signal are required to be different from each in the 1T-S and 1T-N modes of operation. As further indicated, the logic level states of the enable signals (T3/T2EN and T1EN) are also provided. These enable signals will be described further below, with regard to FIG. 6. As indicated in the table 500, the logic level "V" of the T3/T2EN signal may be either high or low.

Figure 6:
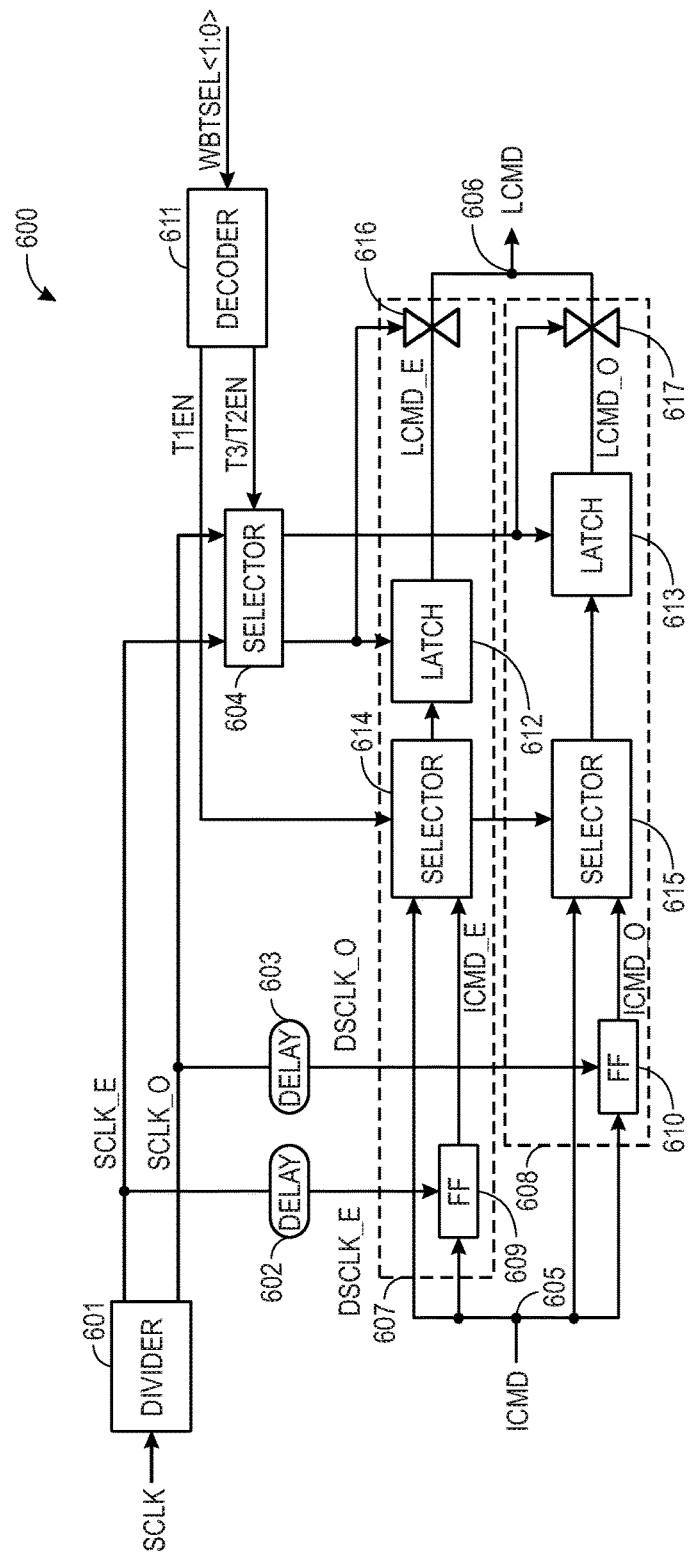
FIG. 6 is a block diagram of a timing circuit of FIG. 2, in accordance with an embodiment of the present disclosure.

FIG. 6 is a block diagram of one embodiment of a timing circuit 600, that may be utilized as the timing circuit 204 of FIG. 2, in accordance with an embodiment of the present disclosure. FIGS. 7-12 are timing diagrams of various signals during operation of the timing circuit 600 of FIG. 6, in each of the 6 respective modes of operation described above, in accordance with an embodiment of the present disclosure, as will be described in greater detail below.

The timing circuit 600 may receive the system clock signal SCLK that has a clock cycle of tCK. The SCLK is delayed a delay time D 1, compared to the clock signal CK, as will be illustrated in FIGS. 7-12. The system clock signal SCLK may include even cycles (e.g., cycle 0, cycle 2, cycle 4, etc.) and odd cycles (e.g., cycle 1, cycle 3, cycle 5, etc.). The timing circuit 600 may include a divider circuit 601. The divider circuit 601 may be a frequency divider that may provide an even system clock signal SCLK_E and an odd system clock signal SCLK_O responsive to the SCLK signal. For example, the divider circuit 601 may divide a frequency of the SCLK signal, thus a frequency of the SCLK_E and the SCLK_O signals is approximately half the frequency of the SCLK signal. The SCLK_E signal may have even cycles of the SCLK signal as positive half cycles and odd cycles of the SCLK signal as negative half cycles. The SCLK_O signal is a complementary signal of the SCLK_E signal and the SCLK_O signal may have odd cycles of the SCLK signal as positive half cycles and even cycles of the SCLK signal as negative half cycles. In other words, a phase difference between the SCLK_E signal and the SCLK_O signal is about 180 degrees. The SCLK_E signal and the SCLK_O signal may have a clock cycle that is equivalent to two clock cycles of the SCLK (=2tCK).

The timing circuit 600 may include delay circuits 602 and 603 and a selector circuit 604. The timing circuit 600 may also include circuit nodes 605 and 606. The timing circuit 600 may further include an even command timing circuit CTC_E 607 and an odd command timing circuit CTC_O 608 coupled between the circuit nodes 605 and 606. The delay circuit 602 may receive the SCLK_E signal and may further provide a delayed even system clock signal DSCLK_E having a delay D2 relative to the SCLK_E signal, as will be illustrated in FIGS. 7-12. Similarly, the delay circuit 603 may receive the SCLK_O signal and may further provide a delayed odd system clock signal DSCLK_O having a delay D2 relative to the SCLK_O signal. The CTC_E 607 may include a flip-flop circuit (FF) 609 that may latch the ICMD signal on the circuit node 605 responsive to the DSCLK_E signal and may further provide an even internal command signal ICMD_E. The CTC_O 608 may include a flip-flop circuit (FF) 610 that may latch the ICMD signal on the circuit node 605 responsive to the DSCLK_O signal and may further provide an odd internal command signal ICMD_O.

The timing circuit 600 also includes a decoder 611 that receives and decodes the WBTSEL<1:0> signal from the control circuit 210 to provide a T1 mode enable signal T1EN and a T3/T2 mode enable signal T3/T2EN. As previously described, the logic states of the T1EN and T3/T2EN signals are shown in FIG. 5. The high level of the T3/T2EN causes the selector circuit 604 to transfer SCLK_E and SCLK_O respectively to latch circuits 612 and 613, and the low level of the T3/T2EN causes the selector 306 to transfer SCLK_E and SCLK_O respectively to latch circuits 613 and 612.

Additional selector circuits 614 and 615 are provided between FF circuit 609 and latch circuit 612 and between FF circuit 608 and latch circuit 613, respectively. The selector circuits 614 and 615 are each controlled by the T1EN signal. The high level (H) of the T1EN signal causes the selector circuits 614 and 615 to select ICMD, and the low level (L) of the T1EN signal causes the selector circuits 614 and 615 to select the outputs of the FF circuits 609 (i.e., ICMC_E) and 610 (i.e., ICMD_O), respectively.

The timing circuit 600 may perform the three-cycle-operation (3T) responsive to the active T3/T2EN signal (e.g., a logic high level) and may further perform the two-cycle-operation (2T) responsive to the inactive T3/T2EN signal (e.g., a logic low level). In the 3T mode, time adjustment of the CMD signal may use three clock cycles of the SCLK signal in the timing circuit 600. The selector circuit 604 may provide, in the 3T mode, the SCLK_E signal to the CTC_E 607 responsive to the active T3/T2EN signal. The CTC_E 607 includes the latch circuit 612 which is coupled a switch 616. The latch circuit 612 may receive the ICMD_E signal and the SCLK_E signal and may further latch the ICMD_E signal responsive to the SCLK_E signal from the selector circuit 604. The switch 616 may provide an even latched command signal LCMD_E from the latch circuit 612 on the circuit node 606 responsive to the SCLK_E signal from the selector circuit 604. The selector circuit 604 may further provide, in the 3T mode, the SCLK_O signal to the CTC_O 608 responsive to the active T3/T2EN signal. The CTC_O 608 includes the latch circuit 613 which is coupled to a switch 617. The latch circuit 613 may receive the ICMD_O signal and the SCLK_O signal and may further latch the ICMD_O signal responsive to the SCLK_O signal from the selector circuit 604. The switch 617 may provide an odd latched command signal LCMD_O from the latch circuit 613 on the circuit node 606 responsive to the SCLK_O signal from the selector circuit 604. In general, the switches 616 and 617 are configured to open when the respective outputs of the selector circuit 604 are high and configured to close when the respective outputs of the selector circuit 604 are low.

Referring generally to FIGS. 7-12, timing diagrams of each of the 6 modes of operation achievable using the timing circuit 600 in the control block 102 are illustrated. In each of FIGS. 7-12, delay D1 indicates a delay time between the start of the CK signal and the start of the SCLK. Further, delay D2 indicates a delay time of the delay circuits 602 and 603 illustrated and described with reference to FIG. 6. That is, the delay D2 indicates the delay time between SCLK (SCLK_E and SCLK_O) and the delayed SCLK signals DSCLK_E and DSCLK_O, respectively. Delay D3 indicates a time required for the command input buffer/decoder circuit 202 of FIG. 2 to buffer and decode CMDIN and provide the decoded command ICMD. That is, the delay from R/W CMDIN to ICMD.

Figure 7:
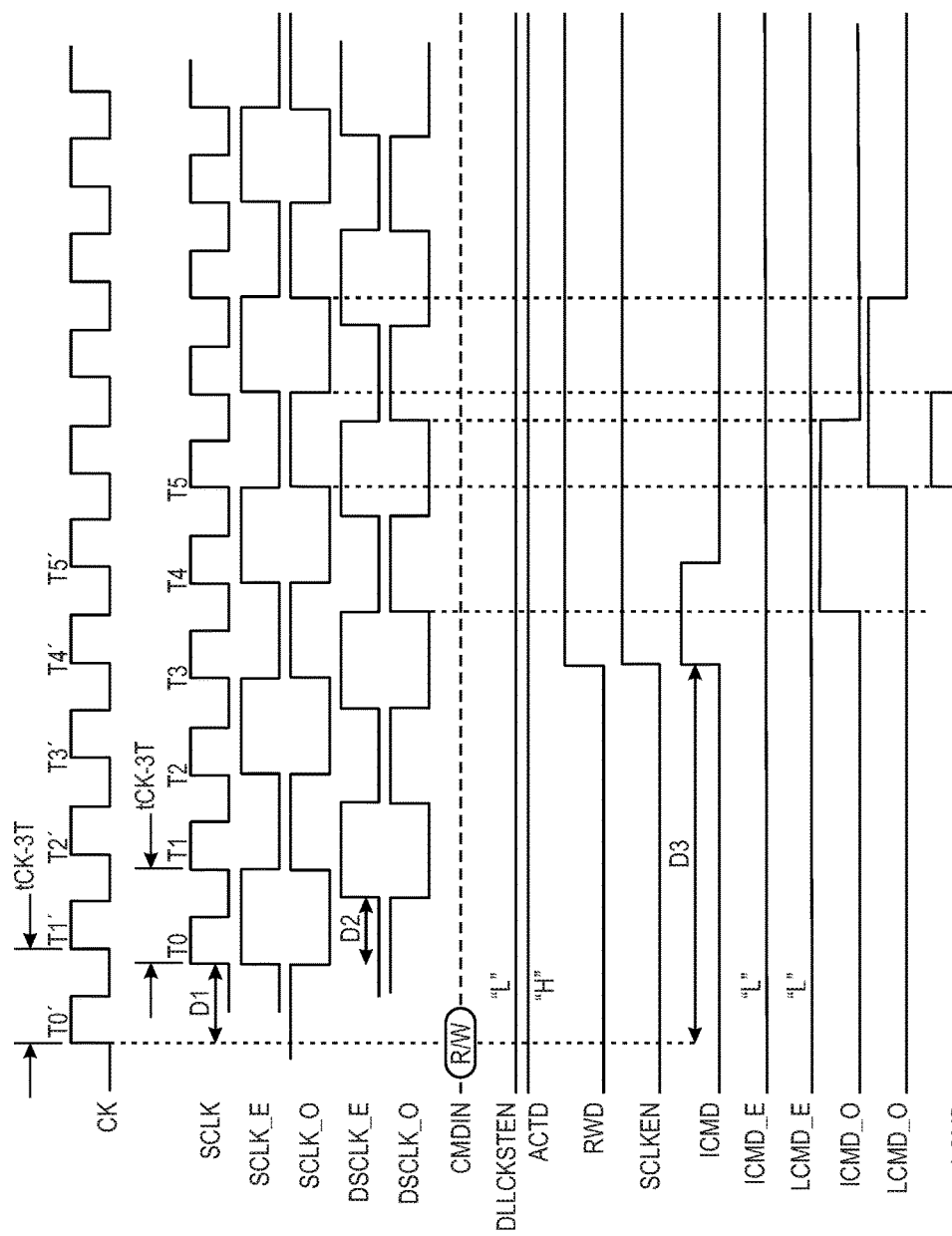
FIG. 7 is a timing diagram of the 3T-S Mode of operation of the control block of FIG. 2, in accordance with an embodiment of the present disclosure.

More specifically, FIG. 7 illustrates the timing of various signals during the 3T-S mode of operation. In the 3T-S mode of operation, the SCLK signal starts to transfer to the DLL in response to the receipt of the R/W commands as CMDIN. That is, the SCLK signal begins to transfer to the DLL in response to the transition from low-to-high of the RWD signal, based on the arrangement of the DLLCKENCNT 205 (FIG. 2) and the state of the DLLCKCTEN signal (low) provided thereto. Further, in the 3T mode of operation, the decoded command signal ICMD is synchronized with the SCLK to provide the LCMD when the clock cycle (illustrated in FIG. 7 as tCK-3T) of the CK (and thus, SCLK) is relatively short compared to the clock cycles in the 2T and 1T modes. Those skilled in the art will appreciate the operation of control block 102 in the 3T-S mode of operation by examining the timing diagram of FIG. 7 in conjunction with the previously described figures and in particular, with reference to FIGS. 2 and 6.

In the timing diagram illustrated in FIG. 7, the SCLK signal is delayed a time D1 from the clock signal CK. Thus, the rising edges of the SCLK signal relative to the CK signal occur at times T0=T0'+D1, T1=T1'+D1, T2=T2'+D1, T3=T3'+D1, T4=T4'+D1 and T5=T5'+D1, for instance. The SCLK_E signal is active in cycles 0, 2 and 4, as illustrated, and the SCLK_O signal is active in cycles 1, 3 and 5 of the SCLK signal. That is, SCLK_E is active (high) between T0 and T1, T2 and T3 and T4 and T5 of the SCLK signal. Conversely, SCLK_O is active (high) between T1 and T2 and T3 and T4 of the SCLK signal. The delay of the DSCLK_E signal relative to the SCLK_E signal provided by the delay circuit 602 is D2, and the DSCLK_E signal has rising edges at time T0+D2, T2+D2 and T4+D2 of the SCLK signal. The delay of the DSCLK_O signal relative to the SCLK_O signal provided by the delay circuit 603 is D2, and the DSCLK_O signal has rising edges at time T1+D2, T3+D2 and T5+D2 of the SCLK.

As previously described, in the 3T-S mode of operation, the DLLCKCTEN signal provided from the control circuit 210 (FIG. 2) to the AND gate 208 of the DLLCKENCNT 205 will remain low. Because the DLLCKCTEN signal remains low, the SCLKEN signal from the OR gate 209 will transition from low-to-high, coincident with the transition of the RWD signal from low-to-high, as provided by the command input buffer/decoder circuit 202, and as indicated in FIG. 7. Thus, the SCLK signal provided to the AND gate 206 will be transferred to the DLL 207 in response to the assertion (e.g., transition from low-to-high) of the RWD signal. In the illustrated example in FIG. 7 indicative of the operation of the command timing circuit CTC_O 608, after the delay D3 and the ICMD signal is asserted, ICMD_O is triggered by the next rising edge of the DSCLK_O signal and latched through the latch 613 coincident with the next rising edge of the SCLK_O signal. The LCMD signal is provided at node 606 for a duration approximately equal to tCK-3T (i.e., the duration of a clock cycle that the SCLK_O signal is high), as illustrated in FIG. 7. As will be appreciated, the signals and functionality of the command timing circuit CTC_E 607 is similar to that of the command timing circuit CTC_O 608.

Figure 8:
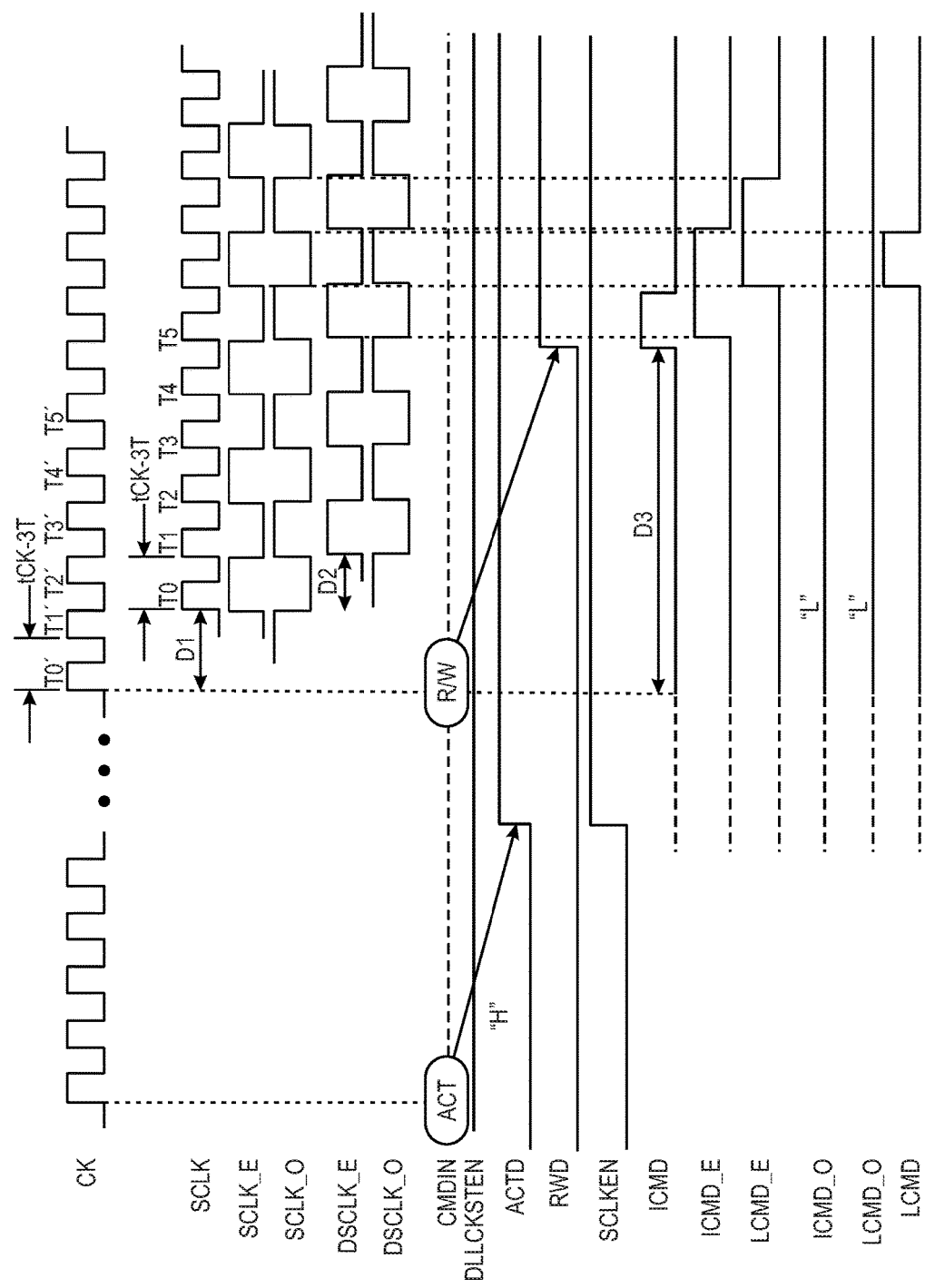
FIG. 8 is a timing diagram of the 3T-N Mode of operation of the control block of FIG. 2, in accordance with an embodiment of the present disclosure.

FIG. 8 illustrates the timing of various signals during the 3T-N mode of operation. In contrast with the 3T-S mode described with reference to FIG. 7, in the 3T-N mode of operation, the SCLK signal starts to transfer to the DLL in response to the receipt of the ACT commands as CMDIN. That is, the SCLK signal begins to transfer to the DLL in response to the transition from low-to-high of the ACTD signal, based on the arrangement of the DLLCKENCNT 205 (FIG. 2) and the state of the DLLCKCTEN signal (high) provided thereto. As previously described, in the 3T mode of operation, the decoded command signal ICMD is synchronized with the SCLK to provide the LCMD when the clock cycle (illustrated in FIG. 8 as tCK-3T) of the CK (and thus, SCLK) is relatively short compared to the clock cycles in the 2T and 1T modes. Those skilled in the art will appreciate the operation of control block 102 in the 3T-N mode of operation by examining the timing diagram of FIG. 8 in conjunction with the previously described figures and in particular, with reference to FIGS. 2, 6 and 7.

Figure 9:
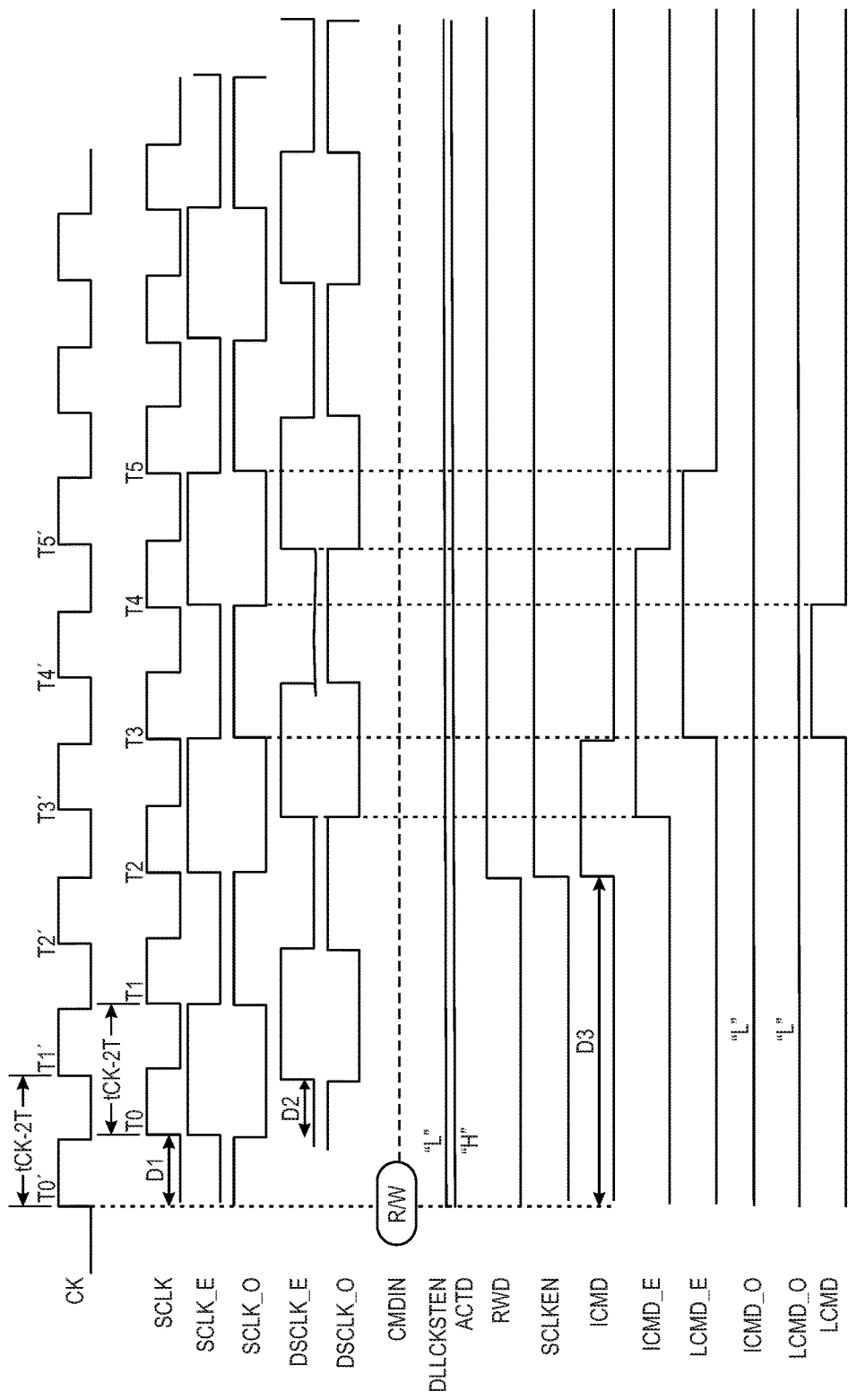
FIG. 9 is a timing diagram of the 2T-S Mode of operation of the control block of FIG. 2, in accordance with an embodiment of the present disclosure.

FIG. 9 illustrates the timing of various signals during the 2T-S mode of operation. As with the 3T-S mode of operation (FIG. 7), in the 2T-S mode of operation, the SCLK signal starts to transfer to the DLL in response to the receipt of the R/W commands as CMDIN. That is, the SCLK signal begins to transfer to the DLL in response to the transition from low-to-high of the RWD signal, based on the arrangement of the DLLCKENCNT 205 (FIG. 2) and the state of the DLLCKCTEN signal (low) provided thereto. Further, in the 2T mode of operation, the decoded command signal ICMD is synchronized with the SCLK to provide the LCMD when the clock cycle (illustrated in FIG. 9 as tCK-2T) of the CK (and thus, SCLK) is of moderate duration compared to the clock cycles in the 3T and 1T modes. That is, in comparing the clock cycles, tCK-3T (FIGS. 7 and 8) is less than tCK-2T (FIG. 9). Those skilled in the art will appreciate the operation of control block 102 in the 2T-S mode of operation by examining the timing diagram of FIG. 9 in conjunction with the previously described figures and in particular, with reference to FIGS. 2, 6 and 7.

Figure 10:
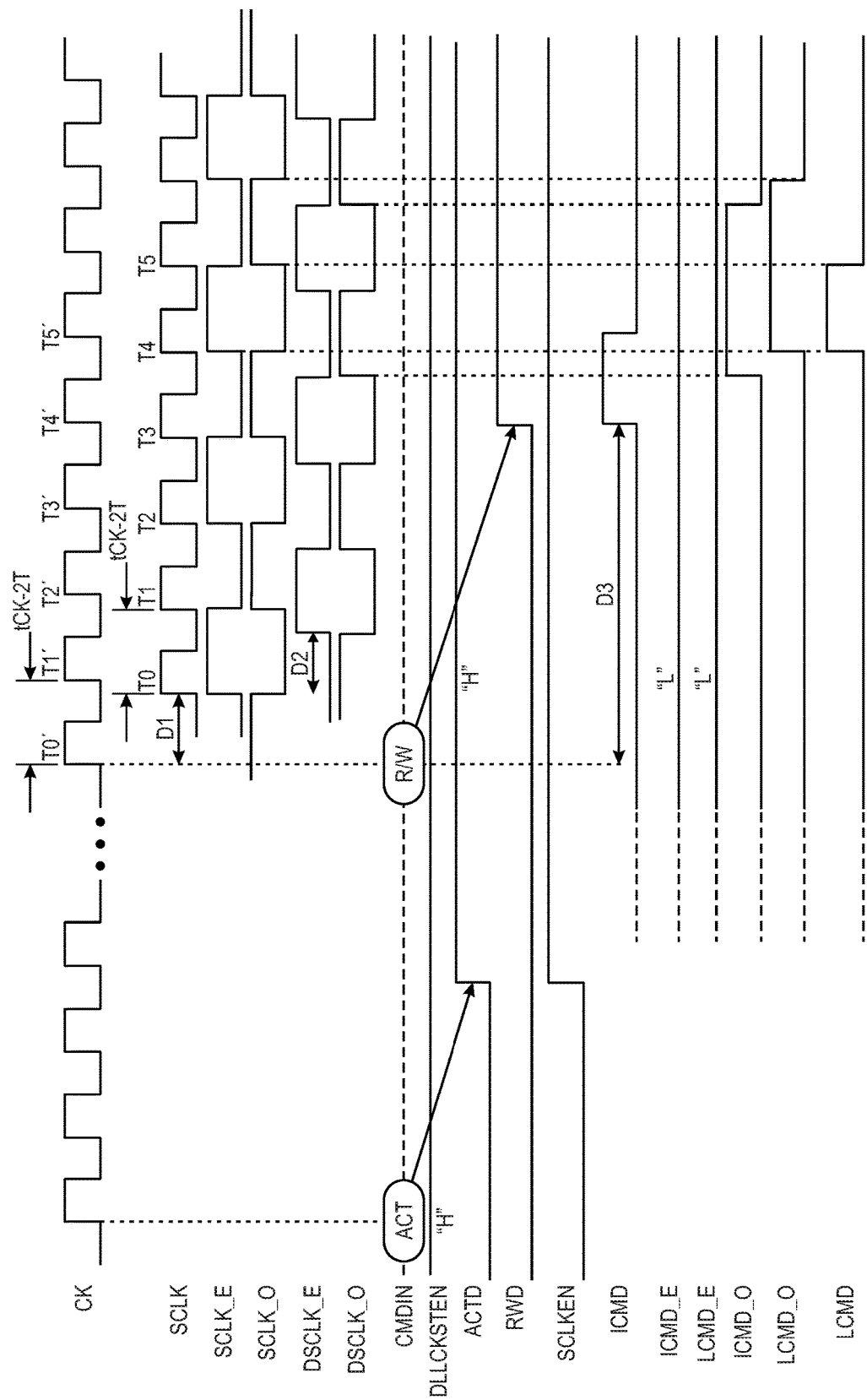
FIG. 10 is a timing diagram of the 2T-N Mode of operation of the control block of FIG. 2, in accordance with an embodiment of the present disclosure.

FIG. 10 illustrates the timing of various signals during the 2T-N mode of operation. In contrast with the 2T-S mode described with reference to FIG. 9, in the 2T-N mode of operation, the SCLK signal starts to transfer to the DLL in response to the receipt of the ACT commands as CMDIN. That is, the SCLK signal begins to transfer to the DLL in response to the transition from low-to-high of the ACTD signal, based on the arrangement of the DLLCKENCNT 205 (FIG. 2) and the state of the DLLCKCTEN signal (high) provided thereto. As previously described, in the 2T mode of operation, the decoded command signal ICMD is synchronized with the SCLK to provide the LCMD when the clock cycle (illustrated in FIG. 10 as tCK-2T) of the CK (and thus, SCLK) is of moderate duration compared to the clock cycles in the 3T and 1T modes. That is, in comparing the clock cycles, tCK-3T (FIGS. 7 and 8) is less than tCK-2T (FIGS. 9 and 10). Those skilled in the art will appreciate the operation of control block 102 in the 2T-N mode of operation by examining the timing diagram of FIG. 10 in conjunction with the previously described figures and in particular, with reference to FIGS. 2, 6 and 7.

Figure 11:
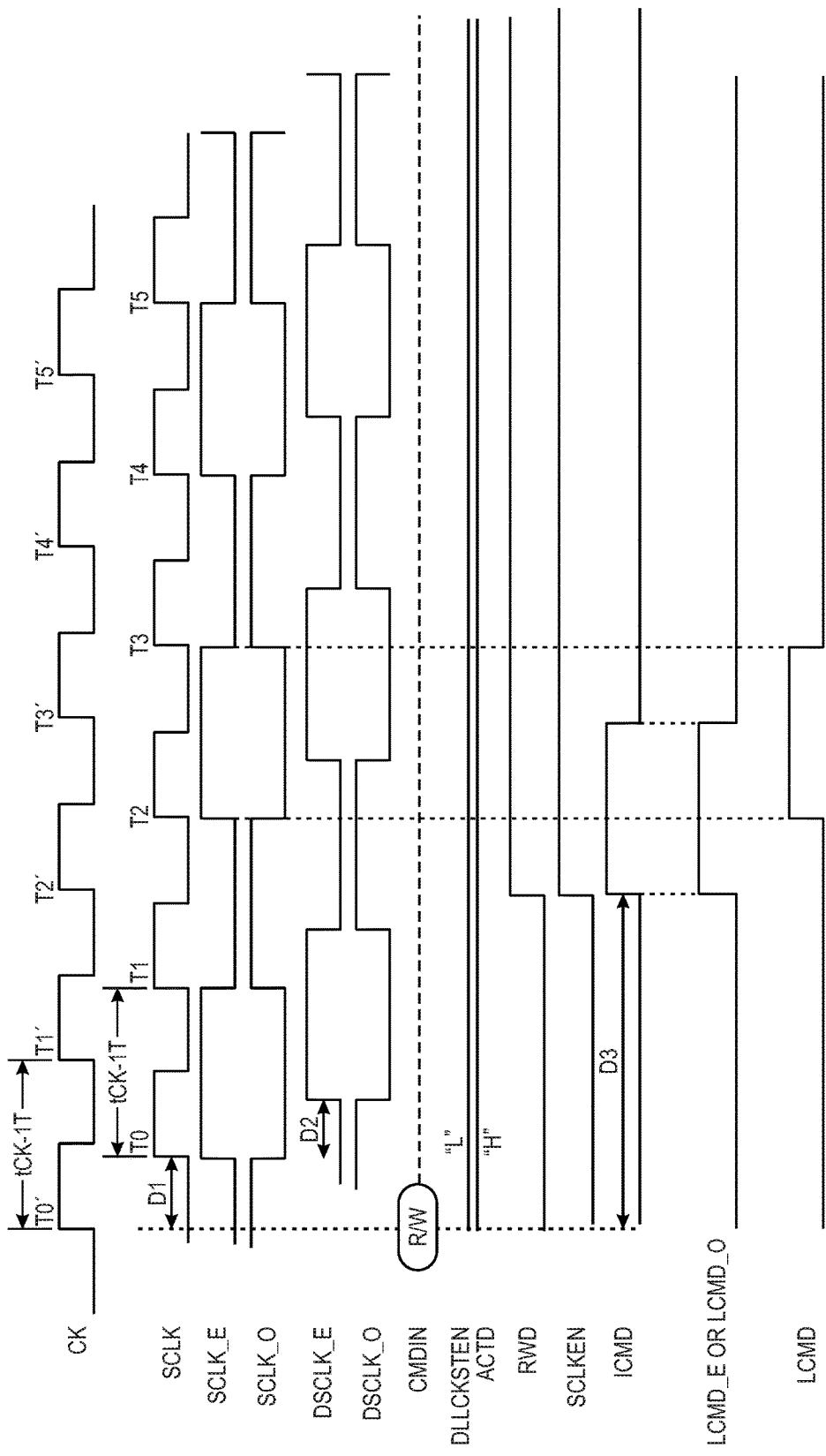
FIG. 11 is a timing diagram of the 1T-S Mode of operation of the control block of FIG. 2, in accordance with an embodiment of the present disclosure.

FIG. 11 illustrates the timing of various signals during the 1T-S mode of operation. As with the 3T-S mode of operation (FIG. 7) and the 2T-S mode of operation (FIG. 9), in the 1T-S mode of operation, the SCLK signal starts to transfer to the DLL in response to the receipt of the R/W commands as CMDIN. That is, the SCLK signal begins to transfer to the DLL in response to the transition from low-to-high of the RWD signal, based on the arrangement of the DLLCKENCNT 205 (FIG. 2) and the state of the DLLCKCTEN signal (low) provided thereto. Further, in the 1T mode of operation, the decoded command signal ICMD is synchronized with the SCLK to provide the LCMD when the clock cycle (illustrated in FIG. 11 as tCK-1T) of the CK (and thus, SCLK) is relatively long compared to the clock cycles in the 3T and 2T modes. That is, in comparing the clock cycles, tCK-1T (FIG. 11) is greater than tCK-2T (FIGS. 9 and 10) which is greater than tCK-3T (FIGS. 7 and 8). Those skilled in the art will appreciate the operation of control block 102 in the 1T-S mode of operation by examining the timing diagram of FIG. 11 in conjunction with the previously described figures and in particular, with reference to FIGS. 2, 6 and 7.

Figure 12:
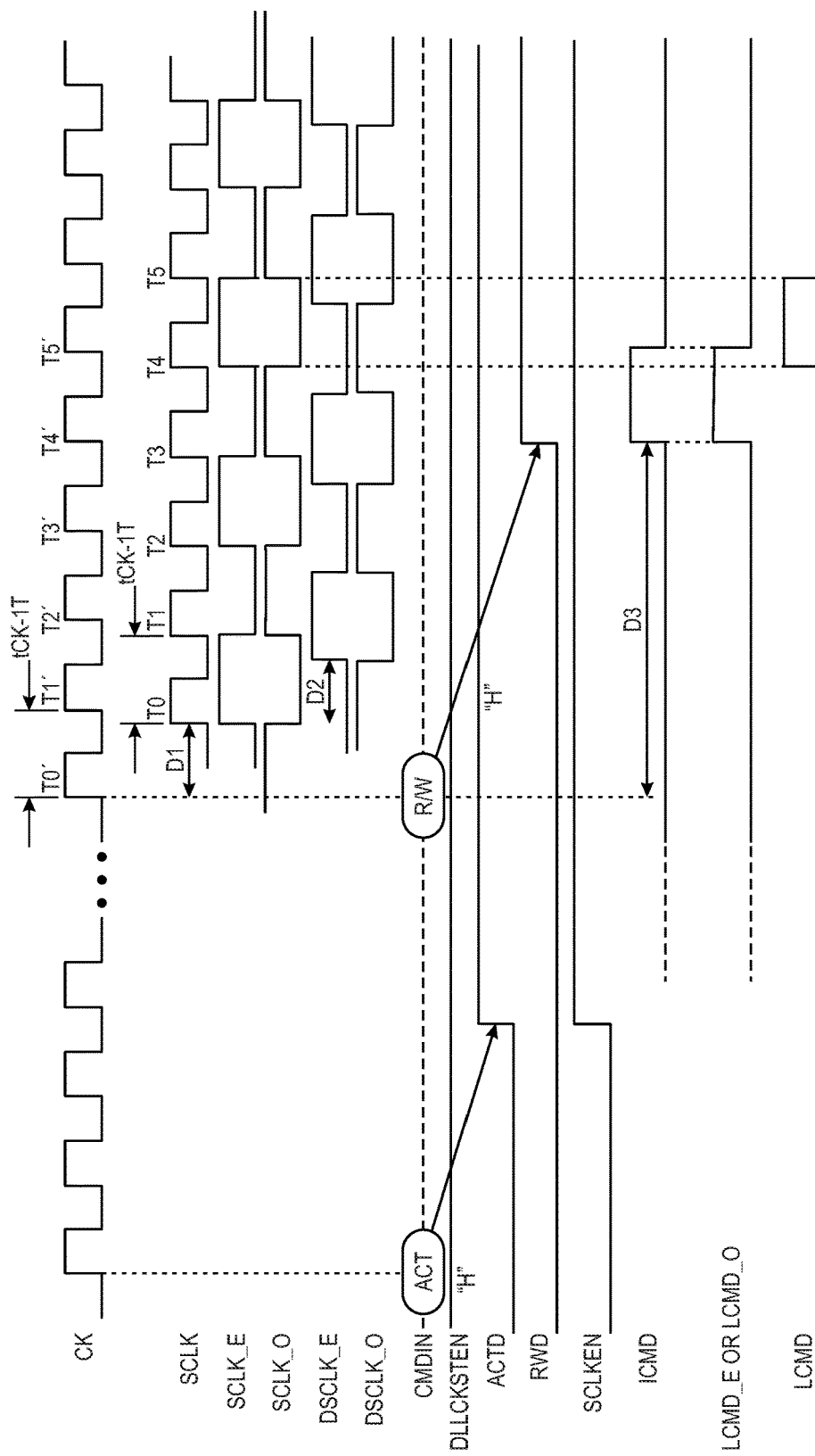
FIG. 12 is a timing diagram of the 1T-N Mode of operation of the control block of FIG. 2, in accordance with an embodiment of the present disclosure.

Finally, FIG. 12 illustrates the timing of various signals during the 1T-N mode of operation. In contrast with the 1T-S mode described with reference to FIG. 11, in the 1T-N mode of operation, the SCLK signal starts to transfer to the DLL in response to the receipt of the ACT commands as CMDIN. That is, the SCLK signal begins to transfer to the DLL in response to the transition from low-to-high of the ACTD signal, based on the arrangement of the DLLCKENCNT 205 (FIG. 2) and the state of the DLLCKCTEN signal (high) provided thereto. As previously described, in the 1T mode of operation, the decoded command signal ICMD is synchronized with the SCLK to provide the LCMD when the clock cycle (illustrated in FIG. 12 as tCK-1T) of the CK (and thus, SCLK) is relatively long compared to the clock cycles in the 3T and 2T modes. That is, in comparing the clock cycles, tCK-1T (FIG. 12) is greater than tCK-2T (FIGS. 9 and 10) which is greater than tCK-3T (FIGS. 7 and 8). Those skilled in the art will appreciate the operation of control block 102 in the 1T-N mode of operation by examining the timing diagram of FIG. 12 in conjunction with the previously described figures and in particular, with reference to FIGS. 2, 6 and 7.

Figure 13:
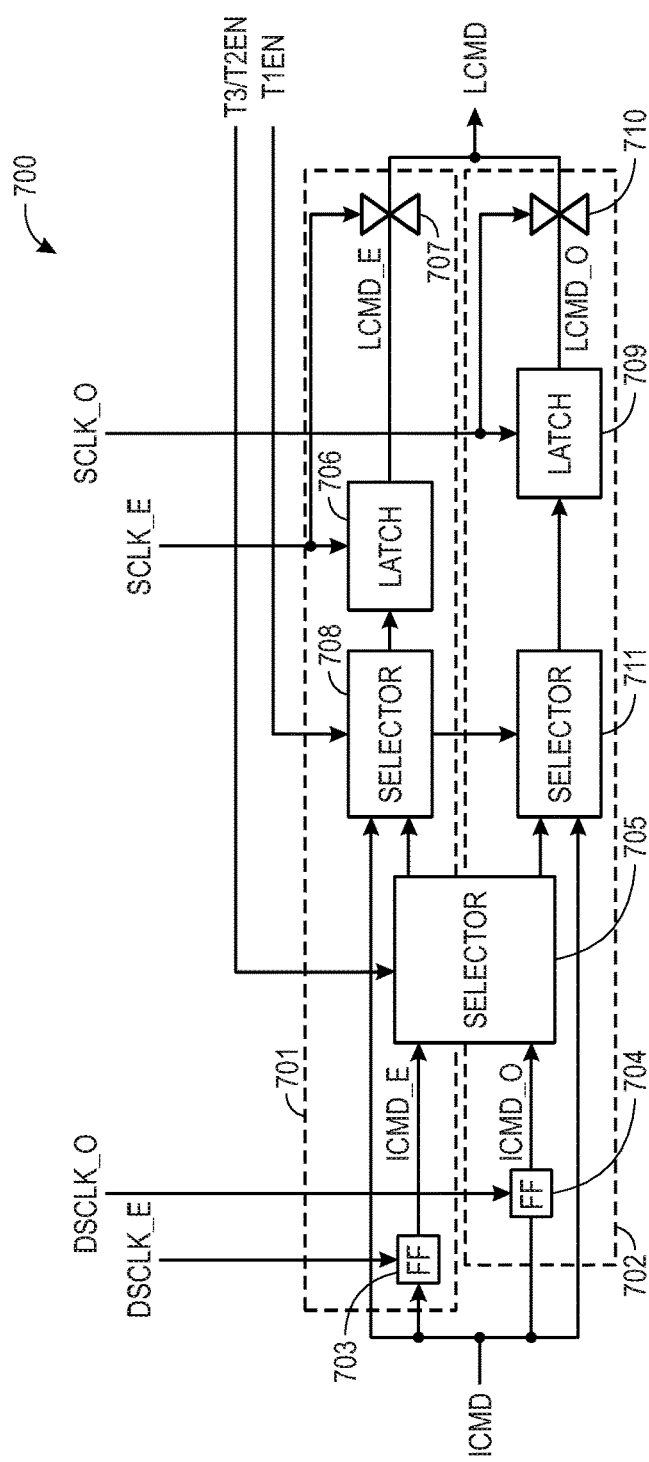
FIG. 13 is a block diagram of a second embodiment of the timing circuit of FIG. 2, in accordance with an embodiment of the present disclosure.

FIG. 13 is a block diagram of a timing circuit 700 of FIG. 2, in accordance with another embodiment of the present disclosure. For example, the timing circuit 700 may be used as the timing circuit 204 in FIG. 2. While still present in the instant embodiment, certain features of the previously described timing circuit 600 (FIG. 6) have been omitted, for simplicity. Specifically, the divider circuit 601, delay circuit 602, delay circuit 603 and decoder circuit 611 have been omitted. However, as will be appreciated by those skilled in the art, these elements may be included in the timing circuit 700 and function as previously described, in order to produce the even and odd SCLK signals SCLK_E and SCLK_O, respectively, the delayed even and odd SCLK signals DSCLK_E and DSCLK_O, respectively, and the enable signals T3/T2EN and T1EN.

The timing circuit 700 may include an even command timing circuit CTC_E 701 and an odd command timing circuit CTC_O 702. The CTC_E 701 may include a flip-flop circuit (FF) 703 that may latch the ICMD signal responsive to the DSCLK_E signal and may further provide an even internal command signal ICMD_E. The CTC_O 702 may include a flip-flop circuit (FF) 704 that may latch the ICMD signal responsive to the DSCLK_O signal and may further provide an odd internal command signal ICMD_O.

The timing circuit 700 may perform the three-cycle-operation (3T) responsive to the active T3/T2EN signal (e.g., a logic high level) and may further perform the two-cycle-operation (2T) responsive to the inactive T3/T2EN signal (e.g., a logic low level). In the 3T mode, time adjustment of the CMD signal may use three clock cycles of the SCLK signal in the timing circuit 700. The timing circuit 700 may receive the T3/T2EN signal from the decoder 611 (FIG. 6) at a selector circuit 705. The CTC_E 701 may include a latch circuit 706, a switch 707 and a selector circuit 708. The CTC_O 702 may include a latch circuit 709, a switch 710 and a selector circuit 711. The selector circuit 705 may provide the ICMD_E signal to the latch circuit 706 through the selector circuit 708, responsive to the active T3/T2EN signal. The latch circuit 706 may receive the ICMD_E signal and the SCLK_E signal and may further latch the ICMD_E signal responsive to the SCLK_E signal. The switch 707 may provide an even latched command signal LCMD_E from the latch circuit 706 responsive to the SCLK_E signal. The latch circuit 709 may receive the ICMD_O signal (through the selector circuit 711, responsive to the active T3/T2EN signal) and the SCLK_O signal and may further latch the ICMD_O signal responsive to the SCLK_O signal. The switch 710 may provide an odd latched command signal LCMD_O from the latch circuit 709 responsive to the SCLK_O signal.

In the 2T mode, the time adjustment of the CMD signal may use two clock cycles of the SCLK signal in the timing circuit 700. The selector circuit 705 may provide the ICMD_O signal to the latch circuit 706 through the selector circuit 708 and the ICMD_E signal to the latch circuit 709 through the selector circuit 711, responsive to the inactive T3/T2EN signal. The latch circuit 706 may receive the ICMD_O signal and the SCLK_E signal and may further latch the ICMD_O signal responsive to the SCLK_E signal. The switch 707 may provide an even latched command signal LCMD_E from the latch circuit 706 responsive to the SCLK_E signal. The latch circuit 709 may receive the ICMD_E signal and the SCLK_O signal and may further latch the ICMD_E signal responsive to the SCLK_O signal. The switch 710 may provide an odd latched command signal LCMD_O from the latch circuit 709 responsive to the SCLK_O signal.

The timing circuit 700 also provides for operation in the 1T mode. As described and illustrated, the timing circuit 700 also includes selector circuits 708 and 711. Specifically, the selector circuit 708 is arranged between the selector circuit 705 and the latch circuit 706. The selector circuit 711 is arranged between the selector circuit 705 and the latch circuit 709. The selector circuits 708 and 711 are each controlled by the T1EN signal. The high level (H) of the T1EN signal causes the selector circuits 708 and 711 to select ICMD, and the low level (L) of the T1EN signal causes the selector circuits 708 and 711 to select the outputs of the selector circuit 705 (i.e., ICMC_E or ICMD_O). As illustrated in FIG. 13, the selector circuits 708 and 711 are controlled by the T1EN signal to enable to the T1 mode of operation, as previously described.

Figure 14:
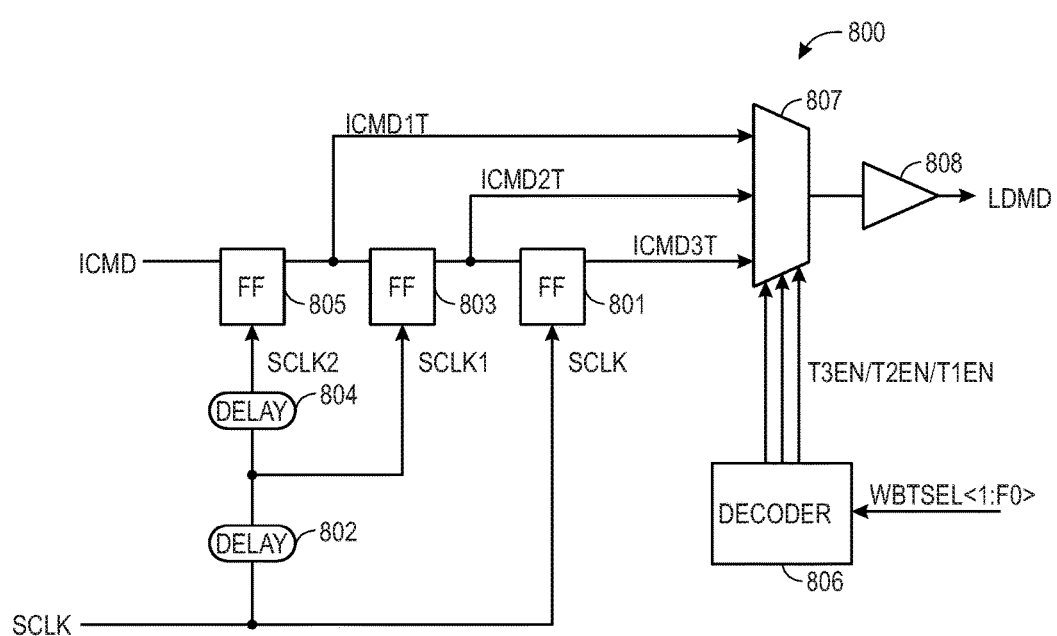
FIG. 14 is a block diagram of a third embodiment of the timing circuit of FIG. 2, in accordance with an embodiment of the present disclosure.
Figure 15:
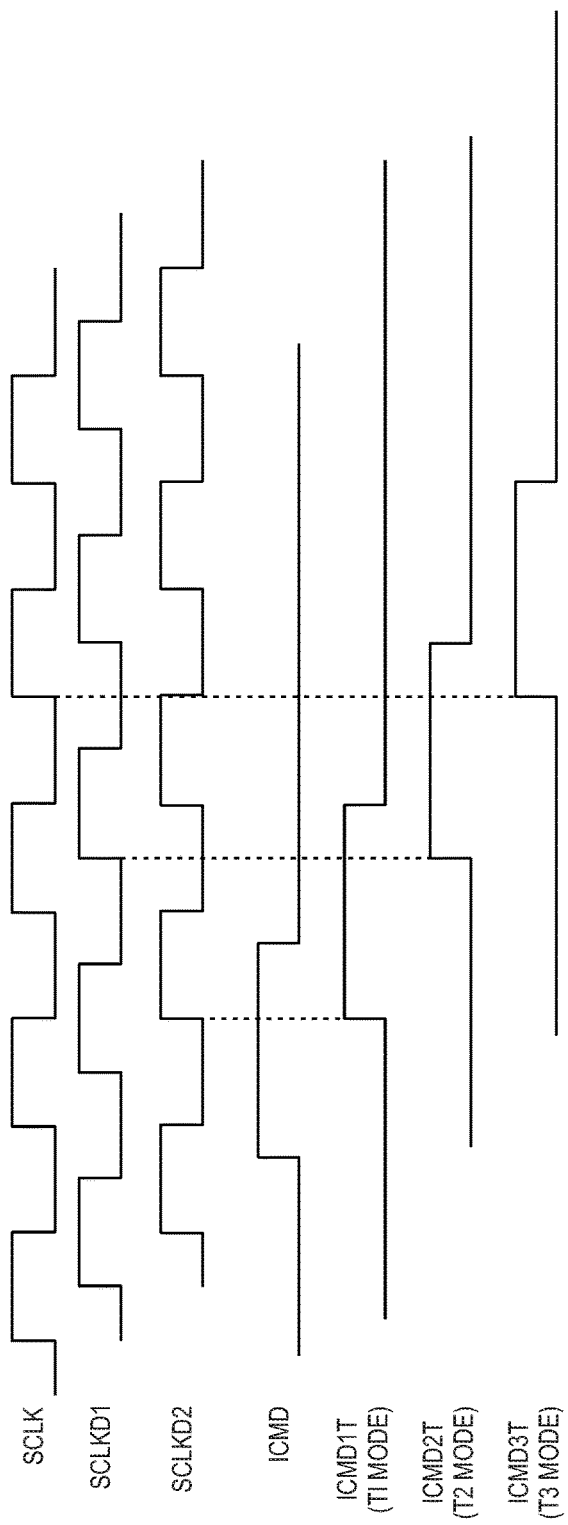
FIG. 15 is a timing diagram of operation of the timing circuit of FIG. 14, in accordance with an embodiment of the present disclosure.

FIG. 14 illustrates a third embodiment of a timing circuit 800, and FIG. 15 is a timing diagram indicative of the operations of the timing circuit 800. The timing circuit 800 may be used in the timing circuit 204 in FIG. 2, for example. The timing circuit 800 is configured to receive the SCLK signal from a clock input buffer 201 (FIG. 2). The SCLK signal is received at a FF circuit 801. From the SCLK signal, a first delayed clock signal SCLK1 and a second delayed clock signal SCLK2 may be provided. Specifically, the SCLK signal is provided to a first delay circuit 802. The delayed SCLK signal is provided by the first delay circuit 802 as SCLK1 and sent to a FF circuit 803. The SCLK1 signal is also provided to a second delay circuit 804 to produce a second delayed clock signal SCLK2. The SCLK2 is then sent to a FF circuit 805. The clock signals SCLK, SCLK1 and SCLK2 are illustrated in FIG. 15. In the illustrated embodiment, each delay circuit 802 and 804 shifts the SCLK signal ¼ tCK. Thus, the SCLK2 signal is the inverse (180° phase difference) of the SCLK signal.

The timing circuit 800 also includes a decoder 806 configured to receive and decode the WBTSEL<1:0> signal to set one of three control signals T3EN, T2EN and T1EN to an active level. The active levels of the enable signals T3EN, T2EN and T1EN cause the selector circuit 807 to select one of ICMD3T, ICMD2T and ICMD1T, from the FF circuit 801, the FF circuit 803 or the FF circuit 805, respectively, depending on the mode of operation. That is, the selector circuit 807 selects the ICMD3T signal from the FF 801, when the WBTSEL<1:0> signal sets the control signal T3EN to active high, thereby enabling the T3 mode of operation. The selector circuit 807 selects the ICMD2T signal from the FF 803, when the WBTSEL<1:0> signal sets the control signal T2EN to active high, thereby enabling the T2 mode of operation. Finally, the selector circuit 807 selects the ICMD1T signal from the FF 805, when the WBTSEL<1:0> signal sets the control signal T1EN to active high, thereby enabling the T1 mode of operation. The activation of these timing signals is illustrated in FIG. 15. The selected one of the ICMD3T, ICMD2T and ICMD1T is provided as LCMD through a buffer 808.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus comprising:
   a circuit node configured to receive a clock signal;
   a delay locked loop (DLL) circuit; and
   a clock enable control circuit coupled between the circuit node and the DLL circuit and configured to operate in a selected one of first and second states;
   wherein the first state is such that the clock signal is allowed to reach the DLL circuit responsive to issuance of at least one of a read command and a write command, and the second state is such that the clock signal is allowed to reach the DLL circuit earlier than the issuance of any one of the read command and the write command.

2. The apparatus of claim 1, wherein the second state is such that the clock signal is allowed to reach the DLL circuit responsive to an active command that is issued earlier than the issuance of any one of the read command and the write command.

3. The apparatus of claim 1, wherein the clock enable control circuit is further configured to receive a control signal, the first state being selected when the control signal is at a first level, and the second state being selected when the control signal is at a second level.

4. The apparatus of claim 3, further comprising control circuitry configured to provide the control signal, the control circuitry further configured to control a level of the control signal based, at least in part, on delay information of the DLL circuit and latency information.

5. The apparatus of claim 4, wherein the latency information comprises a CAS latency and a CAS write latency.

6. The apparatus of claim 1, further comprising a command decoder and a timing circuit,
   wherein the command decoder is configured to decode each of the read command and the write command and provide a decoded command; and
   wherein the timing circuit is configured to synchronize the decoded command with the clock signal.

7. The apparatus of claim 6, wherein the timing circuit is further configured to change synchronizing timing of the decoded command with the clock signal.

8. An apparatus comprising:
   control circuitry configured to generate a first control signal and a second control signal, wherein the first control signal and the second control signal are configured to place the apparatus in one of a plurality of operational modes;
   a clock enable control circuit configured to receive a read command or the write command (RWD) signal corresponding to a read command or a write command, an active decoded (ACTD) signal corresponding to an activate command, a clock signal and the first control signal, wherein an output of the clock enable control circuit is generated, at least in part, based on a state of the first control signal; and
   a timing circuit configured to receive a command signal, the clock signal and the second control signal, wherein an output from the timing circuit is generated, at least in part, based on a state of the second control signal.

9. The apparatus of claim 8, wherein the first control signal and the second control signal are generated, at least in part, based on one or more latency signals and a delay indication signal.

10. The apparatus of claim 9, wherein the control circuitry comprises:

a first calculator circuit configured to provide a first output based on a difference between a first of the one or more latency signals and the delay indication signal; and a second calculator circuit configured to provide a second output based on a difference in a second of the one or more latency signals.

11. The apparatus of claim 10, wherein the control circuitry comprises a judgment circuit configured to receive, as input signals, the first output, the second output and the delay indication signal to provide the first control signal and the second control signal based on the input signals.

12. The apparatus of claim 8, wherein the output of the clock enable control circuit is responsive to an active state of the RWD signal when the first control signal is at a first level, and wherein the output of the clock enable control circuit is responsive to an active state of the ACTD signal when the first control signal is at a second level.

13. The apparatus of claim 8, wherein each of the plurality of operational modes indicates:

whether the output of the clock enable control circuit is generated based on the RWD signal or based on the ACTD signal; and an input of the timing circuit is synchronized with the clock signal to produce the output from the timing circuit based on a clock cycle of the clock signal.

14. The apparatus of claim 8, wherein the second control signal is a 2-bit signal indicative of a relative length of a clock cycle of the clock signal, wherein the relative length of the clock cycle correlates to one of three possible ranges.

15. The apparatus of claim 8, comprising a delay locked loop (DLL) circuit configured to receive the output of the clock enable control circuit, wherein:

the output is generated based on the ACTD signal when the first control signal is in a first state; and the output is generated based on the RWD signal when the first control signal is in a second state.

16. The apparatus of claim 8, further comprising a command decoder, wherein:

the command decoder is configured to decode each of a read command and a write command and provide a decoded command to the timing circuit; and the timing circuit is configured to synchronize the decoded command with the clock signal.

17. A method of operating an apparatus, comprising:

receiving, at a control circuit, a latency information and delay locked loop (DLL) delay information;

calculating, at the control circuit, output values of the control circuit, based on the latency information and the DLL delay information; and setting a mode of operation of the apparatus, based on the output values of the control circuit, and wherein the output values of the control circuit indicate whether a DLL circuit achieves a locked condition in response to receipt of read or write commands at a DLL enable control circuit or in response to receipt of activate commands at the DLL enable control circuit.

18. The method of claim 17, wherein:

receiving the latency information comprises receiving each of a column address strobe (CAS) latency signal (CL), CAS write latency signal (CWL); and receiving the DLL delay information comprises receiving a delay indication signal (NT) corresponding to a number of clock cycles from when a DLL circuit receives a clock signal to when the DLL circuit achieves the locked condition.

19. The method of claim 18, calculating the output values comprises:

calculating, at a first calculator circuit, a first output based on a difference between CL and NT (CL-NT);

calculating, at a second calculator circuit, a second output based on a difference between CWL and NT (CWL-NT); and providing, by a judgment circuit, each of a first control signal and a second control signal, based on the first output, the second output and the delay indication signal.

20. The method of claim 19, wherein setting the mode of operation of the apparatus, comprises setting the mode of operation based on the first control signal and the second control signal.

21. The method of claim 17, wherein the output values of the control circuit indicate a relative length of a clock cycle of a clock signal generated within the apparatus, based on an external clock signal, wherein the relative length of the clock cycle correlates to one of three possible ranges.

* * * * *